US009767751B2

(12) United States Patent
Dai

(10) Patent No.: US 9,767,751 B2
(45) **Date of Patent: *Sep. 19, 2017**

(54) GOA CIRCUIT BASED ON OXIDE SEMICONDUCTOR THIN FILM TRANSISTOR

(71) Applicant: Shenzhen China Star Optoelectronics Technology Co., Ltd., Shenzhen (CN)

(72) Inventor: Chao Dai, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 224 days.

This patent is subject to a terminal disclaimer.

(21) Appl. No.: 14/777,521

(22) PCT Filed: Jun. 23, 2015

(86) PCT No.: PCT/CN2015/082010
§ 371 (c)(1),
(2) Date: Sep. 16, 2015

(87) PCT Pub. No.: WO2016/197403
PCT Pub. Date: Dec. 15, 2016

(65) Prior Publication Data

US 2017/0213512 A1 Jul. 27, 2017

(30) Foreign Application Priority Data

Jun. 8, 2015 (CN) .......................... 2015 1 0310266

(51) Int. Cl.
*G11C 19/28* (2006.01)
*G09G 3/36* (2006.01)

(52) U.S. Cl.
CPC ..... *G09G 3/3677* (2013.01); *G09G 2300/043* (2013.01); *G09G 2300/0809* (2013.01)

(58) Field of Classification Search
CPC .......... G09G 3/36; G09G 3/32; G09G 3/3614; G09G 5/003
See application file for complete search history.

(56) References Cited

U.S. PATENT DOCUMENTS 5,631,940 A * 5/1997 Fujikura ................ G11C 19/28 377/64
7,848,477 B2 * 12/2010 Cheng .................... G11C 19/28 377/64

(Continued)

*Primary Examiner* — Olga Merkoulova
(74) *Attorney, Agent, or Firm* — Leong C. Lei

(57) ABSTRACT

The present invention provides a GOA circuit based on oxide semiconductor thin film transistor. By adding the fifty-fifth, fifty-sixth, fifty-seventh thin film transistors (T55, T56, T57) respectively corresponding to the fourth, fifth, second nodes (S(N), K(N), P(N)) in the pull-down holding module (600). The fifty-fifth, fifty-sixth, fifty-seventh thin film transistors (T55, T56, T57) are controlled with the stage transfer signal of the GOA unit circuit of the former N−1th stage or the scan driving signal of the GOA unit circuit of the former N−1th stage to pull down the voltage levels of the fourth, fifth, second nodes (S(N), K(N), P(N)) under circumstance that the first node (Q(N)) is not completely boosted to rapidly deactivate the pull-down holding module (600) for ensuring the normal boost of the voltage level of the first node (Q(N)). The first node (Q(N)) is guaranteed to be high voltage level in the functioning period, and thus, the normal output of the GOA circuit is ensured.

17 Claims, 11 Drawing Sheets

(56) References Cited

U.S. PATENT DOCUMENTS

| | | | | |
|---|---|---|---|---|
| 8,532,248 | B2 * | 9/2013 | Li | G09G 3/3677 377/64 |
| 2007/0019775 | A1 * | 1/2007 | Tsai | G11C 19/28 377/64 |
| 2010/0214279 | A1 * | 8/2010 | Kim | G09G 3/344 345/213 |
| 2011/0069047 | A1 * | 3/2011 | Koyama | G02F 1/1345 345/204 |
| 2011/0228891 | A1 * | 9/2011 | Yang | G11C 19/184 377/75 |
| 2016/0351152 | A1 * | 12/2016 | Dai | G09G 3/3677 |

* cited by examiner

GOA CIRCUIT BASED ON OXIDE SEMICONDUCTOR THIN FILM TRANSISTOR

FIELD OF THE INVENTION

The present invention relates to a display technology field, and more particularly to a GOA circuit based on oxide semiconductor thin film transistor.

BACKGROUND OF THE INVENTION

The Liquid Crystal Display (LCD) possesses advantages of thin body, power saving and no radiation to be widely used in many application scope, such as LCD TV, mobile phone, personal digital assistant (PDA), digital camera, notebook, laptop, and dominates the flat panel display field.

The Active Matrix Liquid Crystal Display (AMLCD) is the most common liquid crystal display device at present. The Active Matrix Liquid Crystal Display comprises a plurality of pixels, and each pixel is electrically coupled to a Thin Film Transistor (TFT). The gate (Gate) of the TFT is coupled to the horizontal scan line. The drain (Drain) of the TFT is coupled to the data line of the vertical direction. The source (Source) of the TFT is coupled to the pixel electrode. The enough voltage is applied to the level scan line, and all the TFTs electrically coupled to the horizontal scan line are activated. Thus, the signal voltage on the data line can be written into the pixel to control the transmittances of different liquid crystals to achieve the effect of controlling colors and brightness. The GOA (Gate Driver on Array) technology utilizes the array (Array) manufacture process of the thin film transistor liquid crystal display panel according to prior art to manufacture the driving circuit of gate row scan on the TFT array substrate for realizing the driving way of scanning the gates row by row. The GOA technology can reduce the bonding procedure of the external Integrated Circuit (IC) and has potential to raise the productivity and lower the production cost. Meanwhile, it can make the liquid crystal display panel more suitable to the narrow frame or non frame design of display products. Indium Gallium Zinc Oxide (IGZO) is an amorphous oxide containing Indium, Gallium and Zinc, and the carrier mobility is 20-30 times of the amorphous silicon thin film transistor, which is capable of magnificently raising the charging/discharging rate of TFT to the pixel electrodes to promote the response speed of the pixels and to realize faster refreshing rate. In the mean time, the line scan rate of the pixels also can be significantly promoted to make the production of the flat panel display with ultra high resolution possible. Besides the amount reduction of the transistors raise the transmission of each pixel. The IGZO display possesses higher efficiency level and the efficiency becomes higher.

With the development of the oxide semiconductor thin film transistor, such as IGZO, the peripheral circuit around the panel based on oxide semiconductor thin film transistor also becomes the focus that people pay lots of attentions. The oxide semiconductor thin film transistor has higher carrier mobility but the threshold voltage thereof is about 0V and the subthreshold range swing is smaller, the voltage Vgs between the gate and the source of many TFT elements as the GOA circuit is in off state generally is 0V. Thus, the design difficulty of the GOA circuit based on the oxide semiconductor thin film transistor will be increased. There will be some function issues happening when the design adaptable to the scan driving circuit for the amorphous silicon semiconductors is applied to the GOA circuit based on the oxide semiconductor thin film transistor. Besides, due to some external factor inductions and the stress effect, there will be a tendency that the threshold voltage diminishes toward minus value to the oxide semiconductor thin film transistor, which may directly result in malfunction of the GOA circuit for the oxide semiconductor thin film transistors. For example, at high temperature, the threshold voltage of the oxide semiconductor thin film transistor will move toward minus value to result in failure of the GOA circuit; similarly, under the function electrical stress function of light irradiation, the threshold voltage of the oxide semiconductor thin film transistor will move toward minus value. Therefore, the influence of the threshold voltage of TFT has to be considered as designing the GOA circuit based on oxide semiconductor thin film transistor.

As shown in FIG. 1, which is a GOA circuit based on oxide semiconductor thin film transistor which is available against the aforesaid issue, comprising a plurality of GOA unit circuits which are cascade connected, and the GOA unit circuit of every stage comprises a pull-up controlling module 100, a pull-up module 200, a transmission module 300, a first pull-down module 400, a bootstrap capacitor module 500 and a pull-down holding module 600. However, the GOA circuit based on oxide semiconductor thin film transistor remains a certain problem existing: the pull-down holding module 600 utilizes the signal of the first node Q(N) to control the ability of pull-down and deactivation. In condition that the element threshold voltage is forward biased, the ability of the pull-down holding module 600 being controlled by the voltage level of the first node Q(N) becomes weak and it cannot be normally deactivated. Accordingly, the first node Q(N) cannot be normally boosted up to the high voltage level in the functioning period, which results in the bad performance of the entire GOA circuit.

SUMMARY OF THE INVENTION

An objective of the present invention is to provide a GOA circuit based on oxide semiconductor thin film transistor, capable of preventing that the pull-down holding module cannot be normally deactivated due to that the threshold voltage is forward biased for ensuring normal output of the GOA circuit.

For realizing the aforesaid objective, the present invention provides a GOA circuit based on oxide semiconductor thin film transistor, comprising a plurality of GOA unit circuits which are cascade connected, and the GOA unit circuit of every stage comprises a pull-up controlling module, a pull-up module, a transmission module, a first pull-down module, a bootstrap capacitor module and a pull-down holding module;

N is set to be a positive integer and except the GOA unit circuit of the first stage, in the GOA unit circuit of the Nth stage:

the pull-up controlling module comprises an eleventh thin film transistor, and a gate of the eleventh thin film transistor receives a stage transfer signal of the GOA unit circuit of the former N−1th stage, and a source is electrically coupled to a constant high voltage level, and a drain is electrically coupled to a first node;

the pull-up module comprises: a twenty-first thin film transistor, and a gate of the twenty-first thin film transistor is electrically coupled to the first node, and a source is electrically coupled to an mth clock signal, and a drain is electrically coupled to a scan driving signal;

the transmission module comprises: a twenty-second thin film transistor, and a gate of the twenty-second thin film transistor is electrically coupled to the first node, and a source is electrically coupled to the mth clock signal, and a drain outputs the stage transfer signal;

the first pull-down module comprises: a fortieth thin film transistor, and both a gate and a source of the fortieth thin film transistor are electrically coupled to the first node, and a drain is electrically coupled to the drain of a forty-first thin film transistor; a forty-first thin film transistor, and a gate of the forty-first thin film transistor is electrically coupled to an m+2th clock signal, and a source is electrically coupled to the drain of the fortieth thin film transistor, and a source receives the scan driving signal;

the bootstrap capacitor module comprises a capacitor, and one end of the capacitor is electrically coupled to the first node, and the other end is electrically coupled to the scan driving signal;

the pull-down holding module at least comprises: a fifty-first thin film transistor, and both a gate and a source of the fifty-first thin film transistor are electrically coupled to the constant high voltage level, and a drain is electrically coupled to a fourth node; a fifty-second thin film transistor, and a gate of the fifty-second thin film transistor is electrically coupled to the first node, and a drain is electrically coupled to the fourth node, and a source is electrically coupled to the first negative voltage level; a fifty-third thin film transistor, and a gate of the fifty-third thin film transistor is electrically coupled to the fourth node, and a source is electrically coupled to the constant high voltage level, and a drain is electrically coupled to the second node; a fifty-fourth thin film transistor, and a gate of the fifty-fourth thin film transistor is electrically coupled to the first node, and a source is electrically coupled to the second node, and a drain is electrically coupled to a fifth node; a seventy-third thin film transistor, and a gate of the seventy-third thin film transistor is electrically coupled to the fourth node, and a source is electrically coupled to the constant high voltage level, and a drain is electrically coupled to the fifth node; a seventy-fourth thin film transistor, and a gate of the seventy-fourth thin film transistor is electrically coupled to the first node, and a source is electrically coupled to a constant low voltage level, and a drain is electrically coupled to the fifth node; a fifty-fifth thin film transistor, and a gate of the fifty-fifth thin film transistor receives the stage transfer signal of the GOA unit circuit of the former N−1th stage or the scan driving signal of the GOA unit circuit of the former N−1th stage, and a source is electrically coupled to the fourth node, and a drain is electrically coupled to a first negative voltage level; a forty-second thin film transistor, and a gate of the forty-second thin film transistor is electrically coupled to the second node, and a source is electrically coupled to the first node, and a drain is electrically coupled to the third node; a thirty-second thin film transistor, and a gate of the thirty-second thin film transistor is electrically coupled to the second node, and a source is electrically coupled to the scan driving signal, and a drain is electrically coupled to the first negative voltage level; a seventy-fifth thin film transistor, and a gate of the seventy-fifth thin film transistor is electrically coupled to the first node, and a source is electrically coupled to the third node, and a drain is electrically coupled to the constant high voltage level; a seventy-sixth thin film transistor, and a gate of the seventy-sixth thin film transistor is electrically coupled to the second node, and a source is electrically coupled to the third node, and a drain is electrically coupled to the constant low voltage level;

the constant low voltage level is lower than the first negative voltage level;

all the thin film transistors in the GOA unit circuits of all stages are oxide semiconductor thin film transistors.

The pull-down holding module further comprises: a fifty-sixth thin film transistor, and a gate of the fifty-sixth thin film transistor receives the stage transfer signal of the GOA unit circuit of the former N−1th stage or the scan driving signal of the GOA unit circuit of the former N−1th stage, and a source is coupled to the fifth node, and a drain is electrically coupled to the constant low voltage level.

The pull-down holding module further comprises: a fifty-sixth thin film transistor, and a gate of the fifty-sixth thin film transistor receives the stage transfer signal of the GOA unit circuit of the former N−1th stage or the scan driving signal of the GOA unit circuit of the former N−1th stage, and a source is coupled to the fifth node, and a drain is electrically coupled to the constant low voltage level; a fifty-seventh thin film transistor, and a gate of the fifty-seventh thin film transistor receives the stage transfer signal of the GOA unit circuit of the former N−1th stage or the scan driving signal of the GOA unit circuit of the former N−1th stage, and a source is coupled to the second node, and a drain is electrically coupled to the fifth node.

In the GOA unit circuit of the first stage of the GOA circuit based on oxide semiconductor thin film transistor, the gate of the eleventh thin film transistor receives a scan activation signal, and a gate of the fifty-fifth thin film transistor receives a scan activation signal.

In the GOA unit circuit of the first stage of the GOA circuit based on oxide semiconductor thin film transistor, the gate of the eleventh thin film transistor receives a scan activation signal, and a gate of the fifty-fifth thin film transistor receives a scan activation signal, and a gate of the fifty-sixth thin film transistor receives a scan activation signal.

In the GOA unit circuit of the first stage of the GOA circuit based on oxide semiconductor thin film transistor, the gate of the eleventh thin film transistor receives a scan activation signal, and a gate of the fifty-fifth thin film transistor receives a scan activation signal, and a gate of the fifty-sixth thin film transistor receives a scan activation signal, and a gate of the fifty-seventh thin film transistor receives a scan activation signal.

In the pull-down holding module, the fifty-first thin film transistor, the fifty-second thin film transistor, the fifty-third thin film transistor, the fifty-fourth thin film transistor, the seventy-third thin film transistor, and the seventy-fourth thin film transistor construct a dual inverter, and the fifty-first thin film transistor, the fifty-second thin film transistor, the fifty-third thin film transistor and the fifty-fourth thin film transistor construct a main inverter, and the seventy-third thin film transistor, and the seventy-fourth thin film transistor construct an auxiliary inverter.

The clock signal comprises four clock signals: a first clock signal, a second clock signal, a third clock signal and a fourth clock signal.

As the mth clock signal is the third clock signal, the m+2th clock signal is the first clock signal, and as the mth clock signal is the fourth clock signal, the m+2th clock signal is the second clock signal.

All the thin film transistors in the GOA unit circuits of all stages are IGZO thin film transistors.

The present invention further provides a GOA circuit based on oxide semiconductor thin film transistor, comprising a plurality of GOA unit circuits which are cascade connected, and the GOA unit circuit of every stage comprises a pull-up controlling module, a pull-up module, a transmission module, a first pull-down module, a bootstrap capacitor module and a pull-down holding module;

N is set to be a positive integer and except the GOA unit circuit of the first stage, in the GOA unit circuit of the Nth stage:

the pull-up controlling module comprises an eleventh thin film transistor, and a gate of the eleventh thin film transistor receives a stage transfer signal of the GOA unit circuit of the former N−1th stage, and a source is electrically coupled to a constant high voltage level, and a drain is electrically coupled to a first node;

the pull-up module comprises: a twenty-first thin film transistor, and a gate of the twenty-first thin film transistor is electrically coupled to the first node, and a source is electrically coupled to an mth clock signal, and a drain is electrically coupled to a scan driving signal;

the transmission module comprises: a twenty-second thin film transistor, and a gate of the twenty-second thin film transistor is electrically coupled to the first node, and a source is electrically coupled to the mth clock signal, and a drain outputs the stage transfer signal;

the first pull-down module comprises: a fortieth thin film transistor, and both a gate and a source of the fortieth thin film transistor are electrically coupled to the first node, and a drain is electrically coupled to the drain of a forty-first thin film transistor; a forty-first thin film transistor, and a gate of the forty-first thin film transistor is electrically coupled to an m+2th clock signal, and a source is electrically coupled to the drain of the fortieth thin film transistor, and a source receives the scan driving signal;

the bootstrap capacitor module comprises a capacitor, and one end of the capacitor is electrically coupled to the first node, and the other end is electrically coupled to the scan driving signal;

the pull-down holding module at least comprises: a fifty-first thin film transistor, and both a gate and a source of the fifty-first thin film transistor are electrically coupled to the constant high voltage level, and a drain is electrically coupled to a fourth node; a fifty-second thin film transistor, and a gate of the fifty-second thin film transistor is electrically coupled to the first node, and a drain is electrically coupled to the fourth node, and a source is electrically coupled to the first negative voltage level; a fifty-third thin film transistor, and a gate of the fifty-third thin film transistor is electrically coupled to the fourth node, and a source is electrically coupled to the constant high voltage level, and a drain is electrically coupled to the second node; a fifty-fourth thin film transistor, and a gate of the fifty-fourth thin film transistor is electrically coupled to the first node, and a source is electrically coupled to the second node, and a drain is electrically coupled to a fifth node; a seventy-third thin film transistor, and a gate of the seventy-third thin film transistor is electrically coupled to the fourth node, and a source is electrically coupled to the constant high voltage level, and a drain is electrically coupled to the fifth node; a seventy-fourth thin film transistor, and a gate of the seventy-fourth thin film transistor is electrically coupled to the first node, and a source is electrically coupled to a constant low voltage level, and a drain is electrically coupled to the fifth node; a fifty-fifth thin film transistor, and a gate of the fifty-fifth thin film transistor receives the stage transfer signal of the GOA unit circuit of the former N−1th stage or the scan driving signal of the GOA unit circuit of the former N−1th stage, and a source is electrically coupled to the fourth node, and a drain is electrically coupled to a first negative voltage level; a forty-second thin film transistor, and a gate of the forty-second thin film transistor is electrically coupled to the second node, and a source is electrically coupled to the first node, and a drain is electrically coupled to the third node; a thirty-second thin film transistor, and a gate of the thirty-second thin film transistor is electrically coupled to the second node, and a source is electrically coupled to the scan driving signal, and a drain is electrically coupled to the first negative voltage level; a seventy-fifth thin film transistor, and a gate of the seventy-fifth thin film transistor is electrically coupled to the first node, and a source is electrically coupled to the third node, and a drain is electrically coupled to the constant high voltage level; a seventy-sixth thin film transistor, and a gate of the seventy-sixth thin film transistor is electrically coupled to the second node, and a source is electrically coupled to the third node, and a drain is electrically coupled to the constant low voltage level;

the constant low voltage level is lower than the first negative voltage level;

all the thin film transistors in the GOA unit circuits of all stages are oxide semiconductor thin film transistors;

wherein the clock signal comprises four clock signals: a first clock signal, a second clock signal, a third clock signal and a fourth clock signal;

wherein as the mth clock signal is the third clock signal, the m+2th clock signal is the first clock signal, and as the mth clock signal is the fourth clock signal, the m+2th clock signal is the second clock signal;

wherein all the thin film transistors in the GOA unit circuits of all stages are IGZO thin film transistors.

The benefits of the present invention are: the present invention provides a GOA circuit based on oxide semiconductor thin film transistor. By adding the fifty-fifth, fifty-sixth, fifty-seventh thin film transistors respectively corresponding to the fourth, fifth, second nodes in the pull-down holding module, all the gates of the fifty-fifth, fifty-sixth, fifty-seventh thin film transistors receive the stage transfer signal of the GOA unit circuit of the former N−1th stage or the scan driving signal of the GOA unit circuit of the former N−1th stage. The fifty-fifth, fifty-sixth, fifty-seventh thin film transistors are controlled with the stage transfer signal of the GOA unit circuit of the former N−1th stage or the scan driving signal of the GOA unit circuit of the former N−1th stage to pull down the voltage levels of the fourth, fifth, second nodes under circumstance that the first node is not completely boosted to rapidly deactivate the pull-down holding module for ensuring the normal boost of the voltage level of the first node. The first node is guaranteed to be high voltage level in the functioning period, and thus, the normal output of the GOA circuit is ensured.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
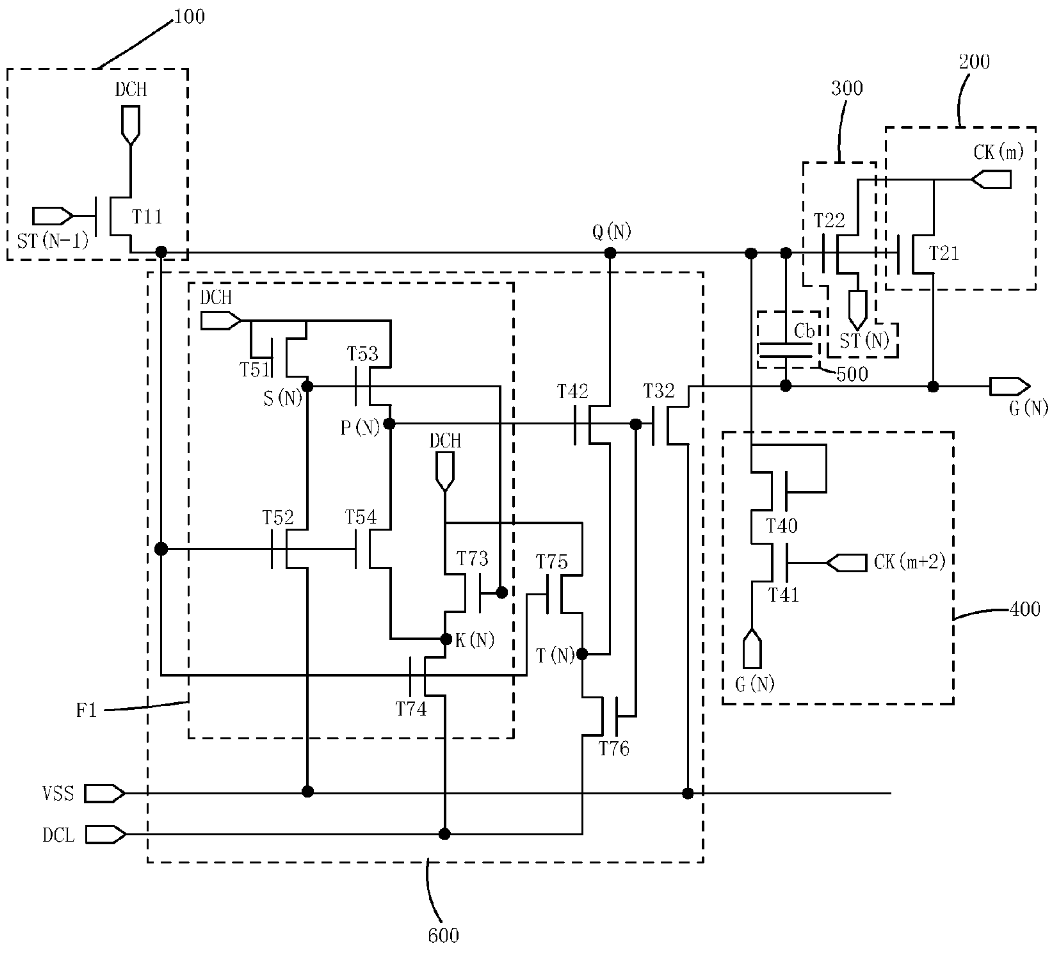
FIG. 1 is a circuit diagram of a GOA circuit based on oxide semiconductor thin film transistor according to prior art.
Figure 2:
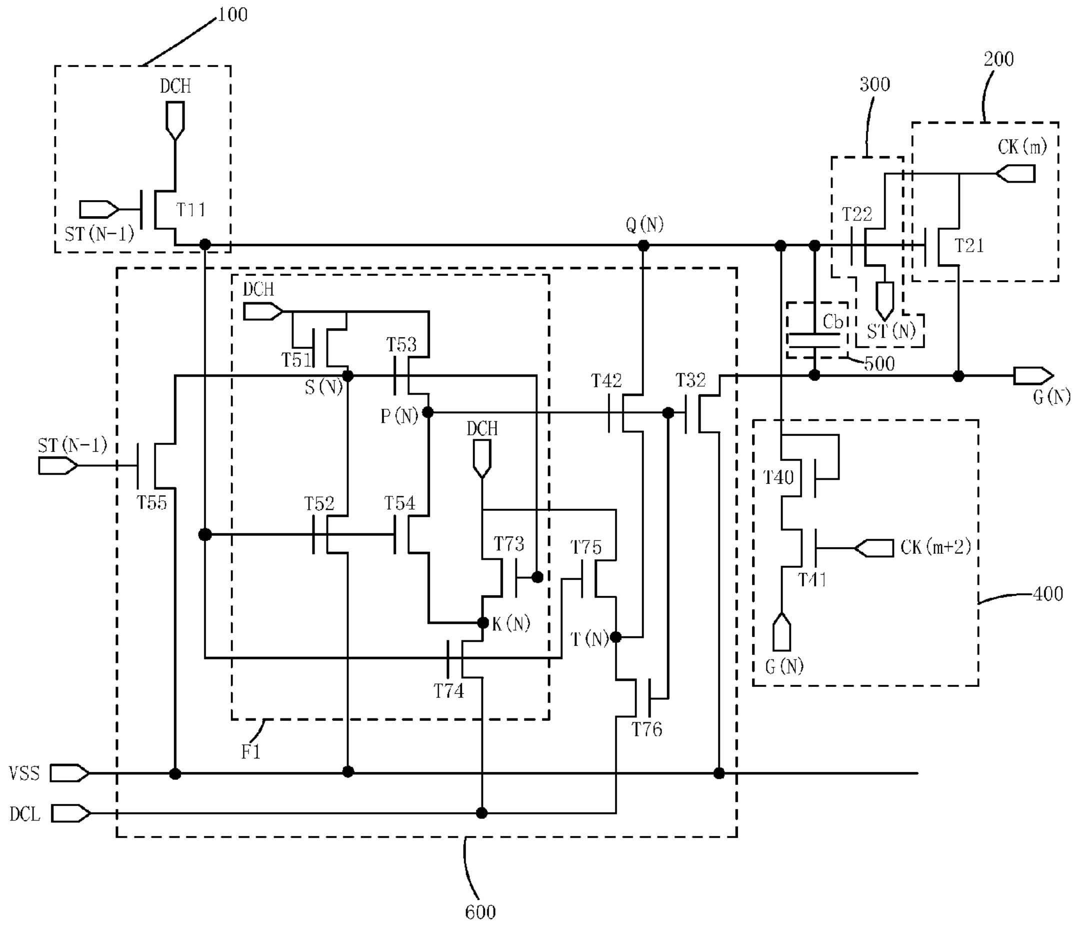
FIG. 2 is a circuit diagram of the first embodiment according to a GOA circuit based on oxide semiconductor thin film transistor of the present invention.

The present invention provides a GOA circuit based on oxide semiconductor thin film transistor. Please refer to FIG. 2. FIG. 2 is a circuit diagram of the first embodiment according to a GOA circuit based on oxide semiconductor thin film transistor of the present invention, comprising a plurality of GOA unit circuits which are cascade connected, and the GOA unit circuit of every stage comprises a pull-up controlling module 100, a pull-up module 200, a transmission module 300, a first pull-down module 400, a bootstrap capacitor module 500 and a pull-down holding module 600.

N is set to be a positive integer and except the GOA unit circuit of the first stage, in the GOA unit circuit of the Nth stage:

the pull-up controlling module 100 comprises: an eleventh thin film transistor T11, and a gate of the eleventh thin film transistor T11 receives a stage transfer signal ST(N−1) of the GOA unit circuit of the former N−1th stage, and a source is electrically coupled to a constant high voltage level DCH, and a drain is electrically coupled to a first node Q(N).

The pull-up module 200 comprises: a twenty-first thin film transistor T21, and a gate of the twenty-first thin film transistor T21 is electrically coupled to the first node Q(N), and a source is electrically coupled to an mth clock signal CK(m), and a drain outputs a scan driving signal G(N).

The pull-down module 300 comprises: a twenty-second thin film transistor T22, and a gate of the twenty-second thin film transistor T22 is electrically coupled to the first node Q(N), and a source is electrically coupled to the mth clock signal CK(m), and a drain outputs the stage transfer signal ST(N).

Specifically, the clock signal comprises four clock signals: a first clock signal CK(1), a second clock signal CK(2), a third clock signal CK(3) and a fourth clock signal CK(4).

As the mth clock signal CK(m) is the third clock signal CK(3), the m+2th clock signal CK(m+2) is the first clock signal CK(1), and as the mth clock signal CK(m) is the fourth clock signal CK(4), the m+2th clock signal CK(m+2) is the second clock signal CK(2).

The first pull-down module 400 comprises: a fortieth thin film transistor T40, and both a gate and a source of the fortieth thin film transistor T40 are electrically coupled to the first node Q(N), and a drain is electrically coupled to the drain of a forty-first thin film transistor T41; the forty-first thin film transistor T41, and a gate of the forty-first thin film transistor T41 is electrically coupled to an m+2th clock signal CK(m+2), and a source is electrically coupled to the scan driving signal G(N).

The bootstrap capacitor module 500 comprises: a capacitor Cb, and one end of the capacitor Cb is electrically coupled to the first node Q(N), and the other end is electrically coupled to the scan drive signal G(N).

The pull-down holding module 600 comprises: a fifty-first thin film transistor T51, and both a gate and a source of the fifty-first thin film transistor T51 are electrically coupled to the constant high voltage level DCH, and a drain is electrically coupled to a fourth node S(N); a fifty-second thin film transistor T52, and a gate of the fifty-second thin film transistor T52 is electrically coupled to the first node Q(N), and a drain is electrically coupled to the fourth node S(N), and a source is electrically coupled to the first negative voltage level VSS; a fifty-third thin film transistor T53, and a gate of the fifty-third thin film transistor T53 is electrically coupled to the fourth node S(N), and a source is electrically coupled to the constant high voltage level DCH, and a drain is electrically coupled to the second node P(N); a fifty-fourth thin film transistor T54, and a gate of the fifty-fourth thin film transistor T54 is electrically coupled to the first node Q(N), and a source is electrically coupled to the second node P(N), and a drain is electrically coupled to a fifth node K(N); a seventy-third thin film transistor T73, and a gate of the seventy-third thin film transistor T73 is electrically coupled to the fourth node S(N), and a source is electrically coupled to the constant high voltage level DCH, and a drain is electrically coupled to the fifth node K(N); a seventy-fourth thin film transistor T74, and a gate of the seventy-fourth thin film transistor T74 is electrically coupled to the first node Q(N), and a source is electrically coupled to a constant low voltage level DCL, and a drain is electrically coupled to the fifth node K(N); a fifty-fifth thin film transistor T55, and a gate of the fifty-fifth thin film transistor T55 receives the stage transfer signal ST(N−1) of the GOA unit circuit of the former N−1th stage, and a source is electrically coupled to the fourth node S(N), and a drain is electrically coupled to the first negative voltage level VSS; a forty-second thin film transistor T42, and a gate of the forty-second thin film transistor T42 is electrically coupled to the second node P(N), and a source is electrically coupled to the first node Q(N), and a drain is electrically coupled to the third node T(N); a thirty-second thin film transistor T32, and a gate of the thirty-second thin film transistor T32 is electrically coupled to the second node P(N), and a source is electrically coupled to the scan driving signal G(N), and a drain is electrically coupled to the first negative voltage level VSS; a seventy-fifth thin film transistor T75, and a gate of the seventy-fifth thin film transistor T75 is electrically coupled to the first node Q(N), and a source is electrically coupled to the third node T(N), and a drain is electrically coupled to the constant high voltage level DCH; a seventy-sixth thin film transistor T76, and a gate of the seventy-sixth thin film transistor T76 is electrically coupled to the second node P(N), and a source is electrically coupled to the third node T(N), and a drain is electrically coupled to the constant low voltage level DCL.

Specifically, the fifty-first thin film transistor T51, the fifty-second thin film transistor T52, the fifty-third thin film transistor T53, the fifty-fourth thin film transistor T54, the seventy-third thin film transistor T73, and the seventy-fourth thin film transistor T74 construct a dual inverter F1, and the fifty-first thin film transistor T51, the fifty-second thin film transistor T52, the fifty-third thin film transistor T53 and the fifty-fourth thin film transistor T54 construct a main inverter, and the seventy-third thin film transistor T73, and the seventy-fourth thin film transistor T74 construct an auxiliary inverter. The constant low voltage level DCL is lower than the first negative voltage level VSS. All the thin film transistors in the GOA unit circuits of all stages are oxide semiconductor thin film transistors. Preferably, the oxide semiconductor thin film transistors are IGZO thin film transistors.

Figure 8:
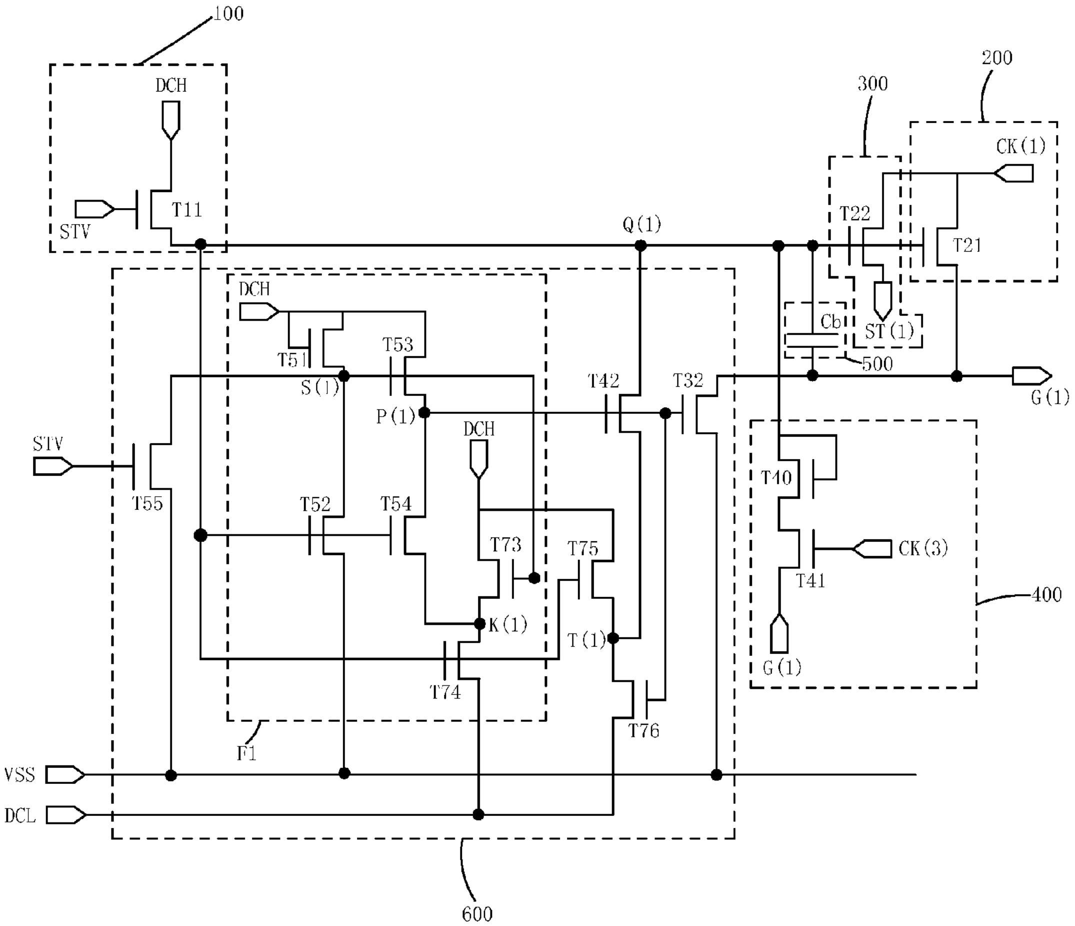
FIG. 8 is a circuit diagram of a GOA unit circuit of the first stage of the first and fourth embodiments according to a GOA circuit based on oxide semiconductor thin film transistor of the present invention.

Particularly, referring to FIG. 8, in the GOA unit circuit of the first stage according to the first embodiment of the present invention, the gate of the eleventh thin film transistor T11 receives a scan activation signal STV, and a gate of the fifty-fifth thin film transistor T55 receives a scan activation signal STV, and both the source of the twenty-first thin film transistor T21 and the source of the twenty-second thin film transistor T22 are electrically coupled to the first clock signal CK(1), and the gate of the forty-first thin film transistor T41 is electrically coupled to the third clock signal CK(3), and the source is inputted with the scan driving signal G(1) of first stage.

Figure 11:
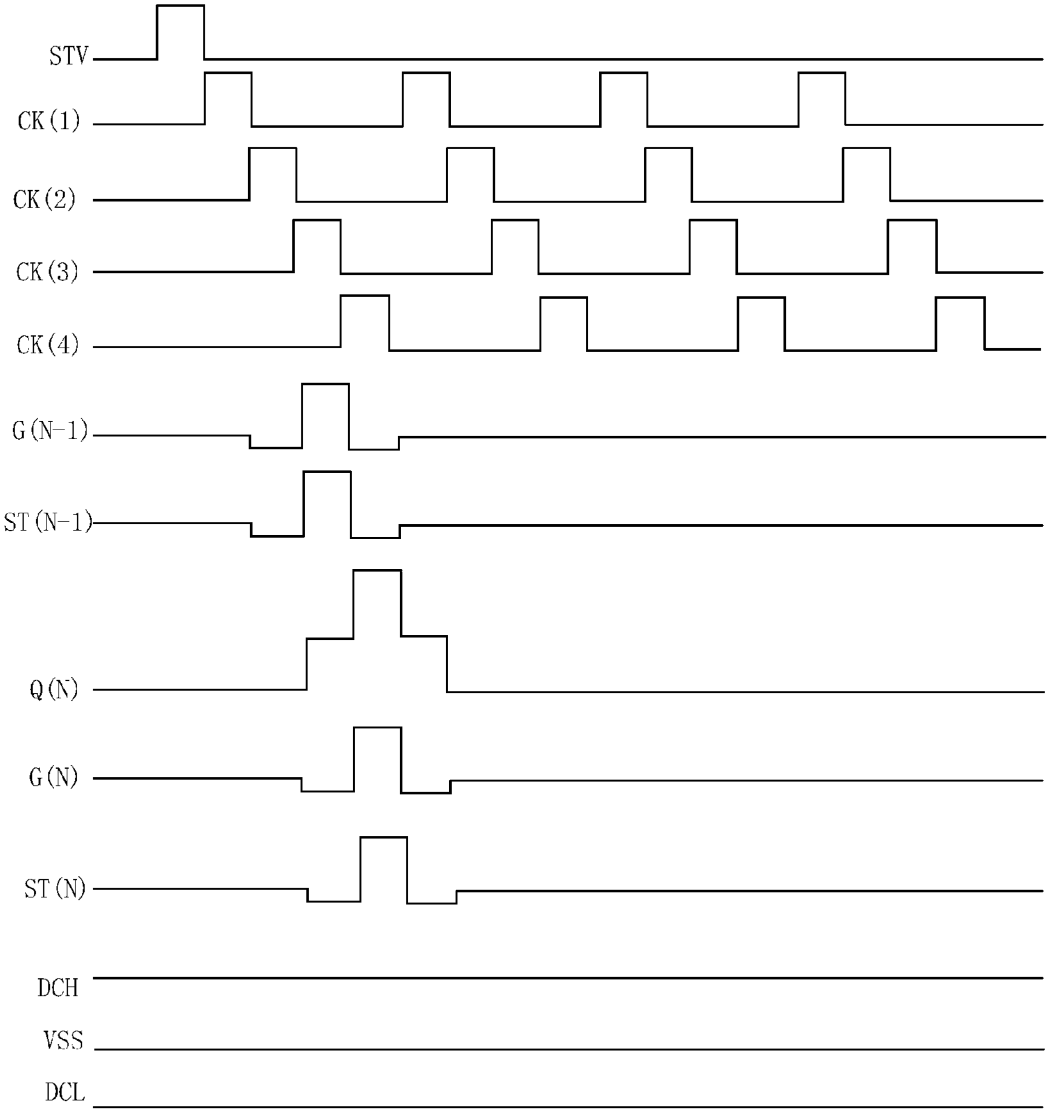
FIG. 11 is an output waveform diagram of the input signals and the key nodes according to a GOA circuit based on oxide semiconductor thin film transistor of the present invention.

Please refer to FIG. 2 and FIG. 11. The working procedure of the first embodiment according to the GOA circuit based on oxide semiconductor thin film transistor of the present invention is: the scan activation signal STV activates the GOA unit circuit of first stage, and the scan driving is performed sequentially stage by stage from the GOA unit circuit of first stage to the GOA unit circuit of last stage. N is set to be a positive integer, and the GOA unit circuit of Nth stage is illustrated. First, the stage transfer signal ST(N−1) of the GOA unit circuit of the former N−1th stage provides high voltage level to the gates of the eleventh thin film transistor T11 and the fifty-fifth thin film transistor T55 (as regarding the GOA unit circuit of first stage, the scan activation signal provides high voltage level to the gates of the eleventh thin film transistor T11 and the fifty-fifth thin film transistor T55), the eleventh thin film transistor T11 and the fifty-fifth thin film transistor T55 are activated, and the constant high voltage level DCH boosts the first node Q(N) to high voltage level through the eleventh thin film transistor T11, and charges the capacitor Cb, and meanwhile, the fifty-fifth thin film transistor T55 pulls down the voltage level of the fourth node S(N) to the first negative voltage level VSS. Thereby, under circumstance that the first node is not completely boosted, the stage transfer signal ST(N−1) of the GOA unit circuit of the former N−1th stage is employed to control the fifty-fifth thin film transistor T55 to be activated to rapidly pull down the voltage level of the fourth node S(N), and to rapidly deactivate the pull-down holding module 600 for ensuring that the first node Q(N) can be boosted to high voltage level. Then, the fourth node S(N) is low voltage level, and the first node Q(N) is high voltage level, and both the fifty-second thin film transistor T52 and the fifty-fourth thin film transistor T54 in the main inverter of the dual inverter F1 are activated, and the fifty-third thin film transistor T53 is deactivated, and the seventy-fourth thin film transistor T74 in the auxiliary inverter is activated, and the seventy-third thin film transistor T73 is deactivated, and the voltage level of the second node P(N) is pulled down to the constant low voltage level DCL which is lower than the first negative low voltage level VSS, and the forty-second, thirty-second, seventy-sixth thin film transistors T42, T32, T76 are activated to ensure that the first node Q(N) and the scan driving signal G(N) steadily output high voltage levels. Subsequently, the stage transfer signal ST(N−1) of the GOA unit circuit of the former N−1th stage is changed to be low voltage level, and the eleventh thin film transistor T11 is deactivated, and the first node Q(N) is kept to be high voltage level through the capacitor Cb to make that the twenty-first thin film transistor T21 and the twenty-second thin film transistor T22 are activated. Then, the mth clock signal CK(m) provides high voltage level to the source of the twenty-first thin film transistor T21 and the source of the twenty-second thin film transistor T22, and the scan driving signal G(N) of high voltage level is outputted through the drain of the twenty-first thin film transistor T21, and the drain of the twenty-second thin film transistor T22 outputs the stage transfer signal ST(N) of high voltage level, and meanwhile, the mth clock signal CK(m) continues to charge the capacitor Cb through the twenty-first thin film transistor T21 to raise up the first node Q(N) to a higher voltage level. Then, the mth clock signal CK(m) is changed to be low voltage level, and the m+2th clock signal CK(m+2) is changed to be low voltage level, and the forty-first thin film transistor T41 and the fortieth thin film transistor T40 are activated, and the first node Q(N) is discharged through the pull-down module 400 and changed to be low voltage level. After scan is finished, the circuit enters the non-functioning period, and then, the first node Q(N) is low voltage level, and both the fifty-second thin film transistor T52 and the fifty-fourth thin film transistor T54 in the main inverter of the dual inverter F1 are deactivated, and the fifty-first thin film transistor T51 is activated to change the voltage level of the fourth node S(N) to be high voltage level, and the fifty-third thin film transistor T53 is activated, and the seventy-fourth thin film transistor T74 in the auxiliary inverter is deactivated, and the seventy-third thin film transistor T73 is activated to prevent the leakage of the fifty-fourth thin film transistor T54 and to make the voltage level of the second node P(N) to be kept at constant high voltage level DCH. In turn, all the forty-second, thirty-second, seventy-sixth thin film transistors T42, T32, T76 are activated to pull down and maintain the voltage level of the first node Q(N) to the constant low voltage level DCL and the voltage level of the scan driving signal G(N) to the first negative voltage level VSS.

In the first embodiment, the fifty-fifth thin film transistor T55 is added for the key node, the fourth node S(N) of the pull-down holding module 600. The fifty-fifth thin film transistor T55 is controlled by the stage transfer signal ST(N−1) of the GOA unit circuit of the former N−1th stage to pull down the voltage level of the fourth node S(N) to the first negative voltage level VSS, and thus, to accomplish the voltage pull-down to the fourth node S(N) under circumstance that the first node Q(N) is not completely boosted to rapidly deactivate the pull-down holding module 600. It can prevent that the voltage level of the fourth node S(N) cannot be pulled down to deactivate the pull-down holding module

600 under circumstance that the first node Q(N) is not completely boosted because the threshold voltage of the fifty-fifth thin film transistor T55 is forward biased. Accordingly, the voltage level of first node Q(N) cannot be normally boosted up, and that the voltage level of first node Q(N) cannot be normally boosted up makes that the pull-down holding module 600 cannot be normally deactivated. Ultimately, the issue of the bad performance of the entire GOA circuit occurs thereby.

Figure 3:
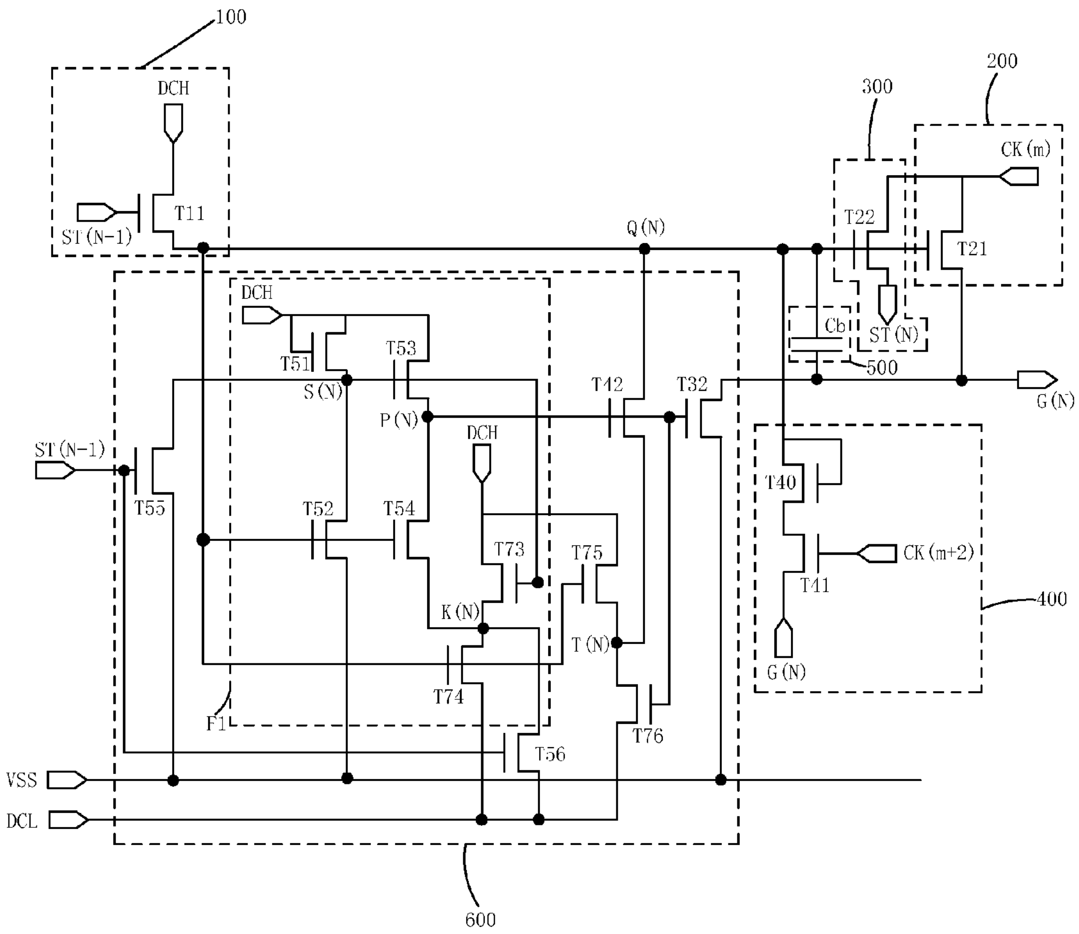
FIG. 3 is a circuit diagram of the second embodiment according to a GOA circuit based on oxide semiconductor thin film transistor of the present invention.

Please refer to FIG. 3 and FIG. 11, which show the second embodiment according to the GOA circuit based on oxide semiconductor thin film transistor of the present invention. The difference between the second embodiment and the first embodiment is that the pull-down holding module 600 further comprises: a fifty-sixth thin film transistor T56, and a gate of the fifty-sixth thin film transistor T56 receives the stage transfer signal ST(N−1) of the GOA unit circuit of the former N−1th stage, and a source is coupled to a fifth node K(N), and a drain is electrically coupled to the constant low voltage level DCL, and as the stage transfer signal ST(N−1) of the GOA unit circuit of the former N−1th stage is high voltage level, the fifty-sixth thin film transistor T56 is activated to pull down the voltage level of the fifth node K(N) to the constant low voltage level DCL, and thus, to accomplish the voltage pull-down to the fifth node K(N) under circumstance that the first node Q(N) is not completely boosted.

Figure 9:
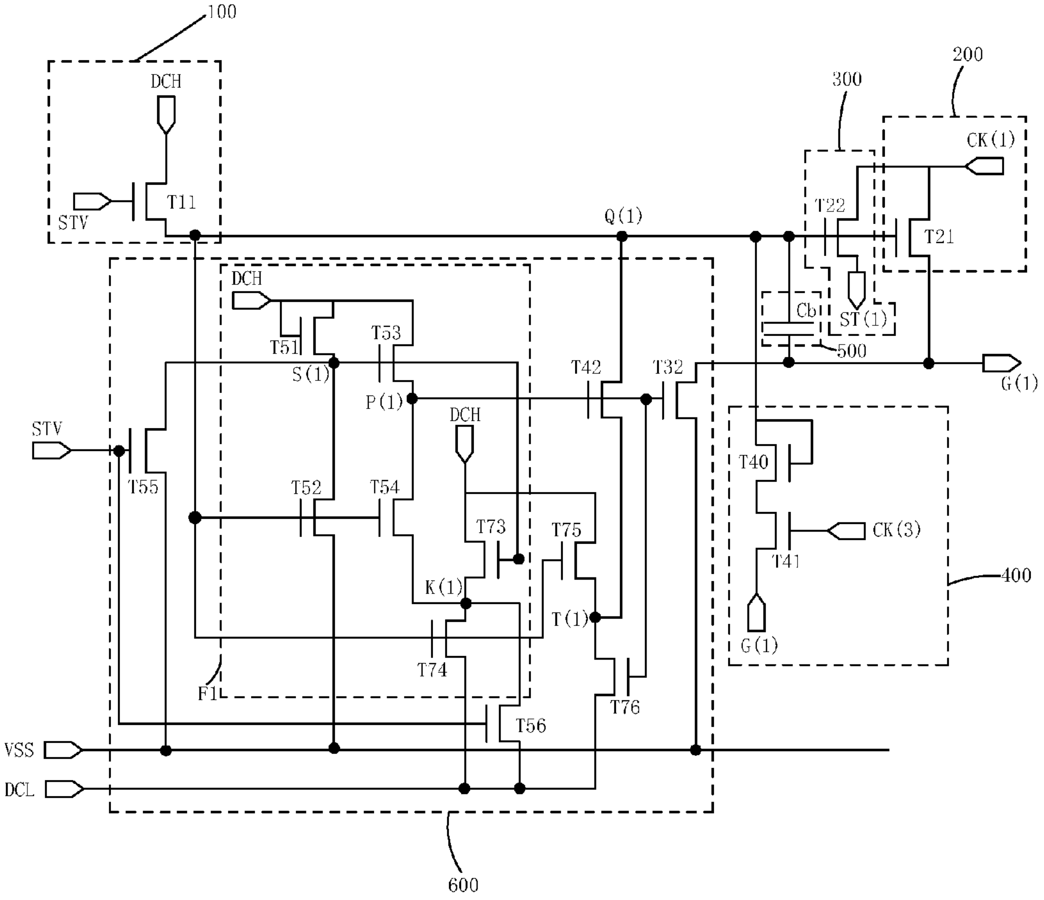
FIG. 9 is a circuit diagram of GOA unit circuits of the first stage of the second and fifth embodiments according to a GOA circuit based on oxide semiconductor thin film transistor of the present invention.

Particularly, referring to FIG. 9, in the GOA unit circuit of the first stage according to the second embodiment of the present invention, the gate of the eleventh thin film transistor T11 receives a scan activation signal STV, and gates of the fifty-fifth thin film transistor T55 and the fifty-sixth thin film transistor T56 receive a scan activation signal STV, and both the source of the twenty-first thin film transistor T21 and the source of the twenty-second thin film transistor T22 are electrically coupled to the first clock signal CK(1), and the gate of the forty-first thin film transistor T41 is electrically coupled to the third clock signal CK(3), and the source is inputted with the scan driving signal G(1) of first stage. The rest circuit structure and working procedure are the same as those described in the first embodiment. The repeated explanation is omitted here.

Figure 4:
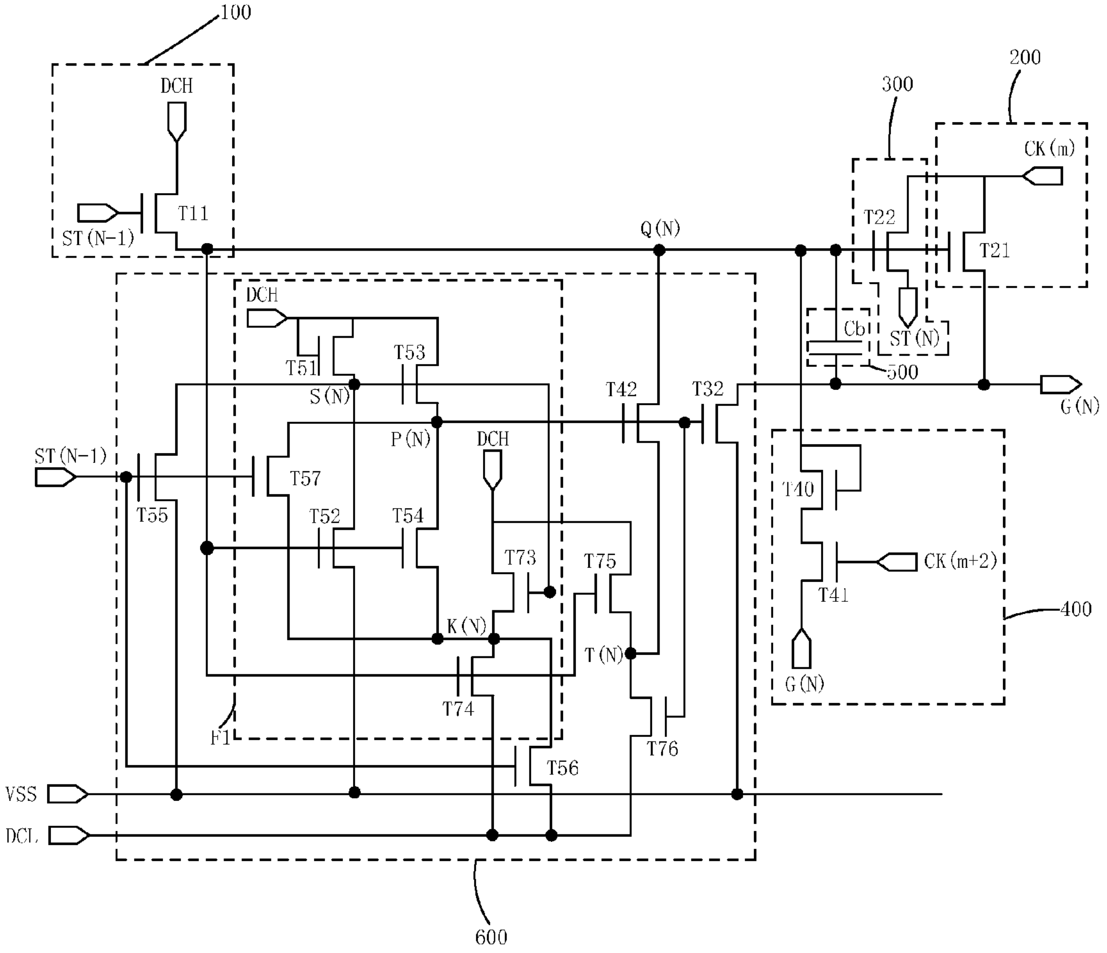
FIG. 4 is a circuit diagram of the third embodiment according to a GOA circuit based on oxide semiconductor thin film transistor of the present invention.

Please refer to FIG. 4 and FIG. 11, which show the third embodiment according to the GOA circuit based on oxide semiconductor thin film transistor of the present invention. The difference between the third embodiment and the second embodiment is that the pull-down holding module 600 further comprises: a fifty-seventh thin film transistor T57, and a gate of the fifty-seventh thin film transistor T57 receives the stage transfer signal ST(N−1) of the GOA unit circuit of the former N−1th stage, and a source is coupled to the second node P(N), and a drain is electrically coupled to the fifth node K(N), and as the stage transfer signal ST(N−1) of the GOA unit circuit of the former N−1th stage is high voltage level, both the fifty-sixth thin film transistor T56 and the fifty-seventh thin film transistor T57 are activated to pull down the voltage levels of the fifth node K(N) and the second node P(N) to the constant low voltage level DCL, and thus, to accomplish the voltage pull-down to the fifth node K(N) and the second node P(N) under circumstance that the first node Q(N) is not completely boosted.

Figure 10:
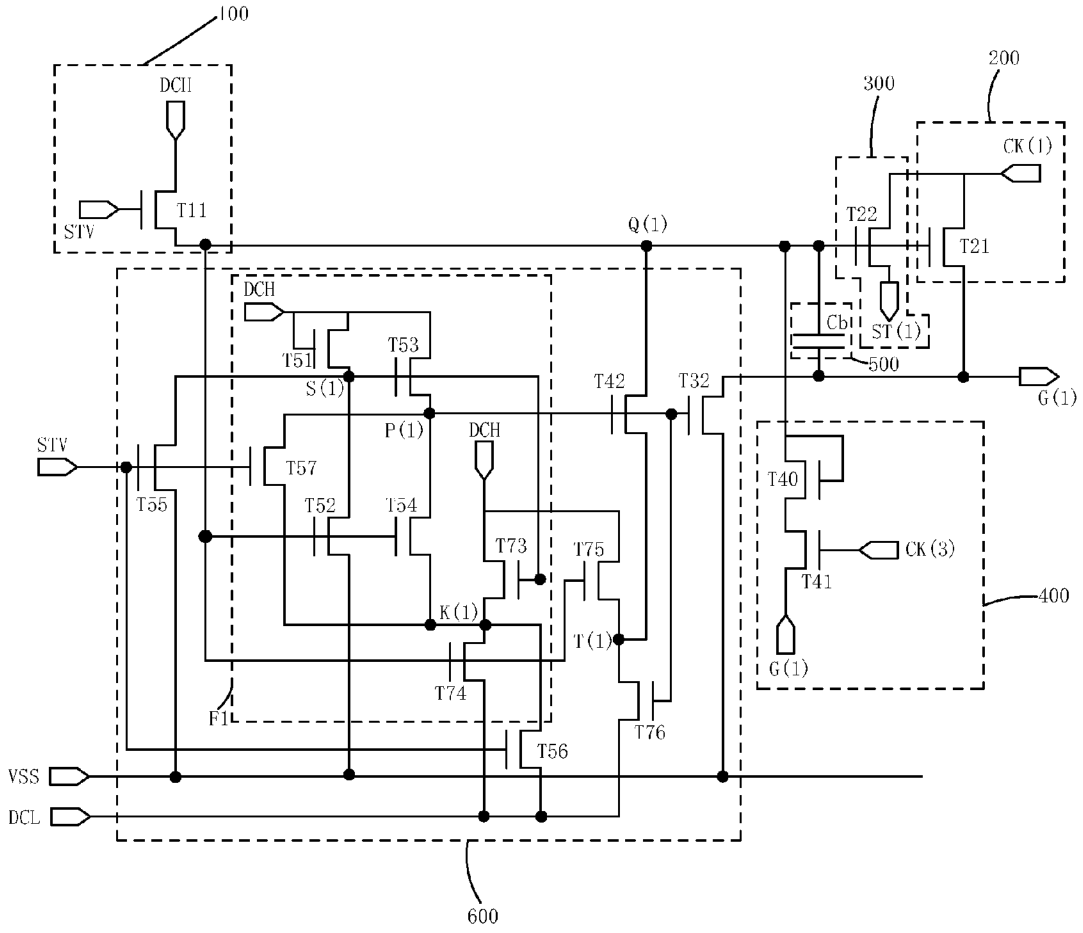
FIG. 10 is a circuit diagram of GOA unit circuits of the first stage of the third and sixth embodiments according to a GOA circuit based on oxide semiconductor thin film transistor of the present invention.

Particularly, referring to FIG. 10, in the GOA unit circuit of the first stage according to the third embodiment of the present invention, the gate of the eleventh thin film transistor T11 receives a scan activation signal STV, and gates of the fifty-fifth thin film transistor T55, the fifty-sixth thin film transistor T56 and the fifty-seventh thin film transistor T57 receive a scan activation signal STV, and both the source of the twenty-first thin film transistor T21 and the source of the twenty-second thin film transistor T22 are electrically coupled to the first clock signal CK(1), and the gate of the forty-first thin film transistor T41 is electrically coupled to the third clock signal CK(3), and the source is inputted with the scan driving signal G(1) of first stage. The rest circuit structure and working procedure are the same as those described in the first embodiment. The repeated explanation is omitted here.

Figure 5:
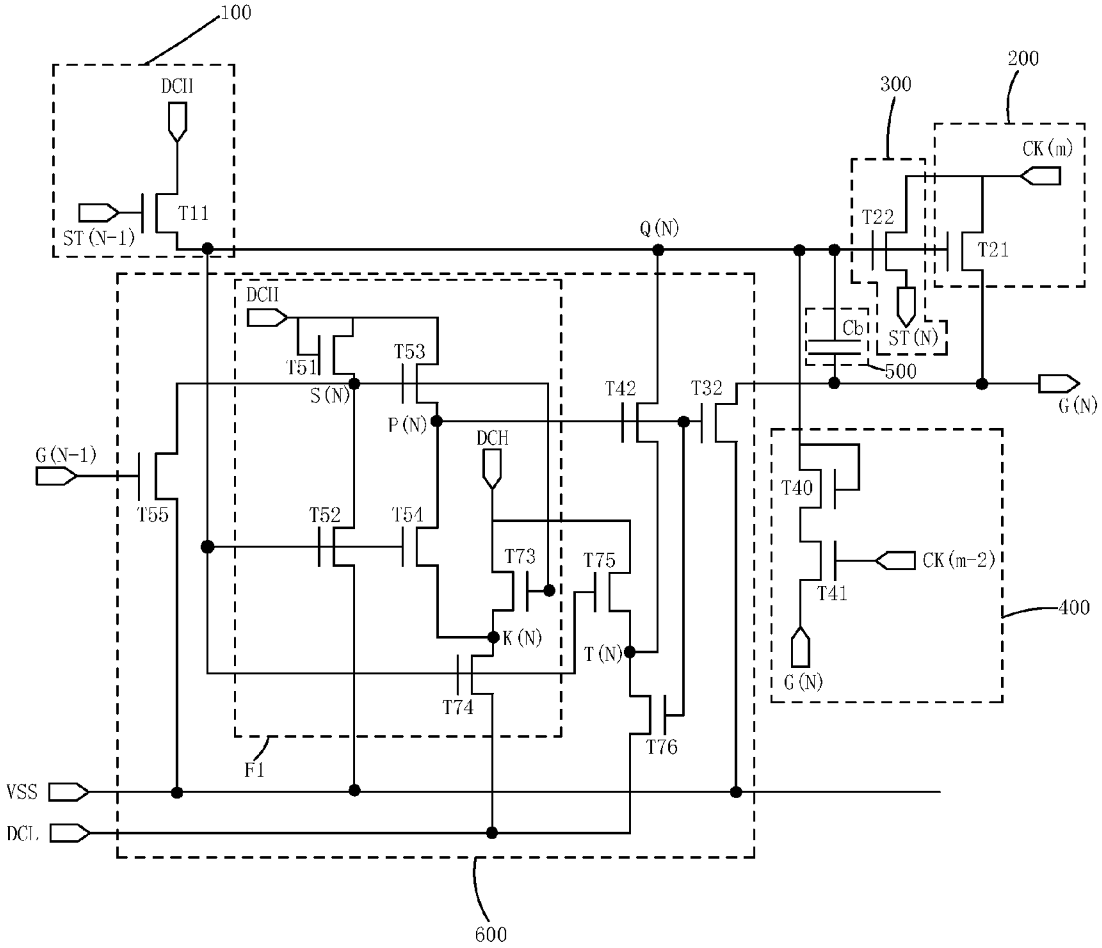
FIG. 5 is a circuit diagram of the fourth embodiment according to a GOA circuit based on oxide semiconductor thin film transistor of the present invention.

Please refer to FIG. 5, FIG. 8 and FIG. 11, which show the fourth embodiment according to the GOA circuit based on oxide semiconductor thin film transistor of the present invention. The difference between the fourth embodiment and the first embodiment is that the gate of the fifty-fifth thin film transistor T55 receives the scan driving signal G(N−1) of the GOA unit circuit of the former N−1th stage. Under circumstance that the first node Q(N) is not completely boosted, the scan driving signal G(N−1) of the GOA unit circuit of the former N−1th stage is employed to control the fifty-fifth thin film transistor T55 to pull down the voltage level of the fourth node S(N). The reset is the same as the first embodiment. The repeated description is omitted here.

Figure 6:
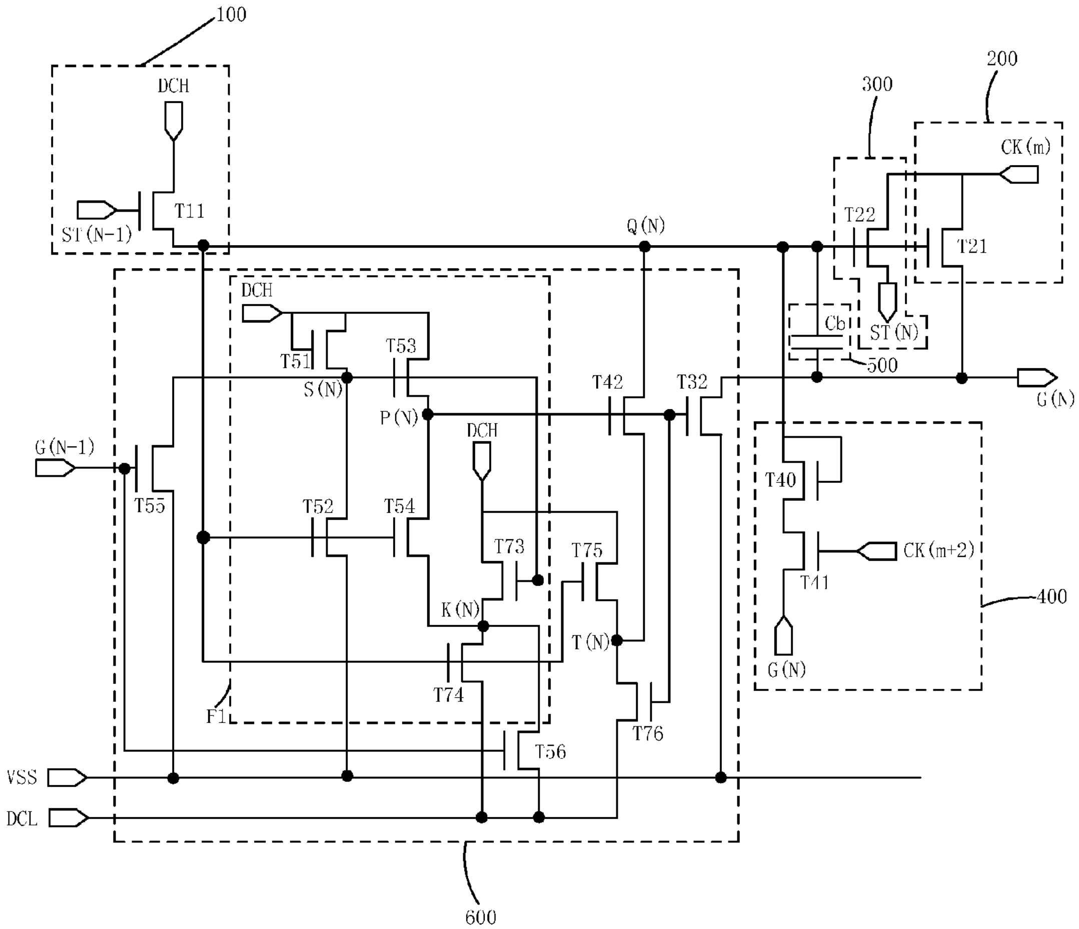
FIG. 6 is a circuit diagram of the fifth embodiment according to a GOA circuit based on oxide semiconductor thin film transistor of the present invention.

Please refer to FIG. 6, FIG. 9 and FIG. 11, which show the fifth embodiment according to the GOA circuit based on oxide semiconductor thin film transistor of the present invention. The difference between the fifth embodiment and the second embodiment is that both the gate of the fifty-fifth thin film transistor T55 and the gate of the fifty-sixth thin film transistor T56 receive the scan driving signal G(N−1) of the GOA unit circuit of the former N−1th stage. Under circumstance that the first node Q(N) is not completely boosted, the scan driving signal G(N-1) of the GOA unit circuit of the former N−1th stage is employed to control the fifty-fifth thin film transistor T55 and the fifty-sixth thin film transistor T56 to respectively pull down the voltage levels of the fourth node S(N) and the fifth node K(N). The reset is the same as the second embodiment. The repeated description is omitted here.

Figure 7:
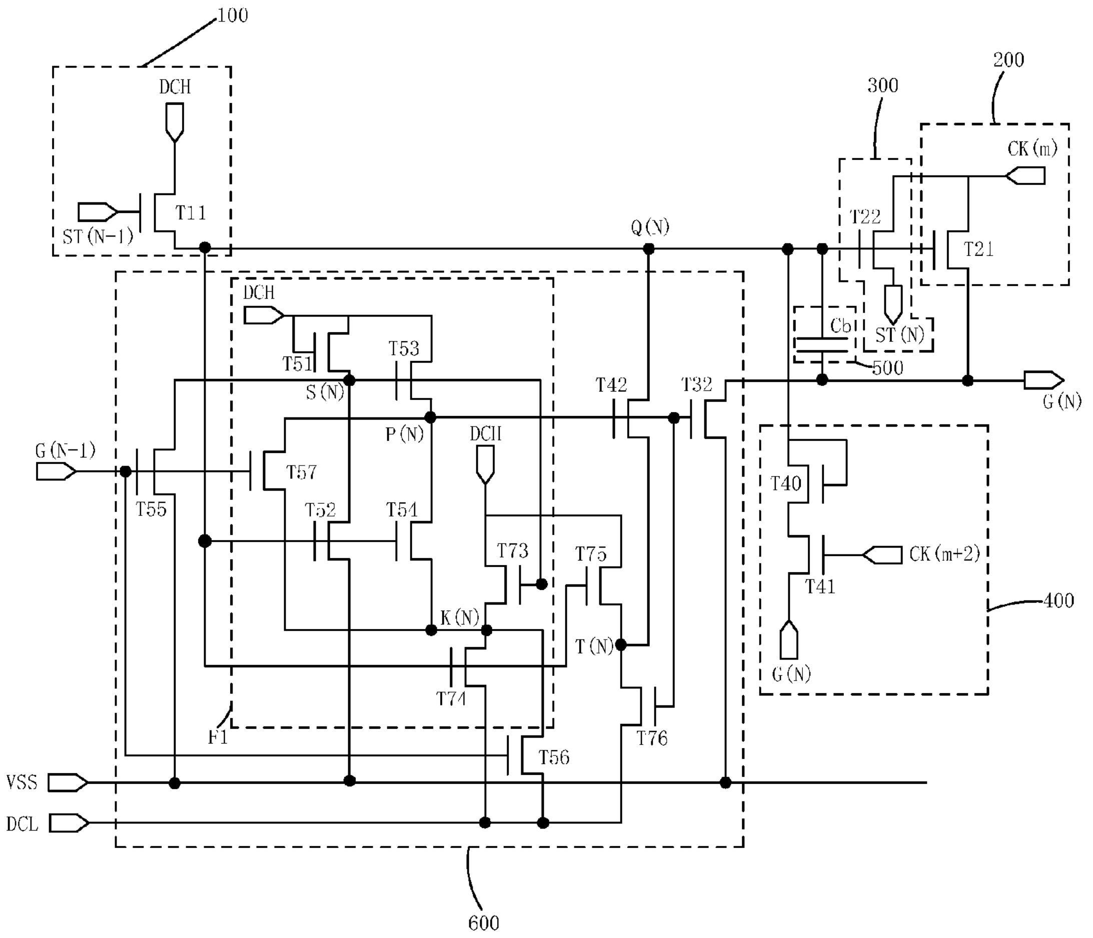
FIG. 7 is a circuit diagram of the sixth embodiment according to a GOA circuit based on oxide semiconductor thin film transistor of the present invention.

Please refer to FIG. 7, FIG. 10 and FIG. 11, which show the sixth embodiment according to the GOA circuit based on oxide semiconductor thin film transistor of the present invention. The difference between the sixth embodiment and the third embodiment is that the gates of the fifty-fifth thin film transistor T55, the fifty-sixth thin film transistor T56, the fifty-seventh thin film transistor T57 receive the scan driving signal G(N−1) of the GOA unit circuit of the former N−1th stage. Under circumstance that the first node Q(N) is not completely boosted, the scan driving signal G(N−1) of the GOA unit circuit of the former N−1th stage is employed to control the fifty-fifth thin film transistor T55, the fifty-sixth thin film transistor T56, and the fifty-seventh thin film transistor T57 to respectively pull down the voltage levels of the fourth node S(N), the fifth node K(N), and the second node P(N). The reset is the same as the third embodiment. The repeated description is omitted here.

In conclusion, the present invention provides a GOA circuit based on oxide semiconductor thin film transistor. By adding the fifty-fifth, fifty-sixth, fifty-seventh thin film transistors respectively corresponding to the fourth, fifth, second nodes in the pull-down holding module, all the gates of the fifty-fifth, fifty-sixth, fifty-seventh thin film transistors receive the stage transfer signal of the GOA unit circuit of the former N−1th stage or the scan driving signal of the GOA unit circuit of the former N−1th stage. The fifty-fifth, fifty-sixth, fifty-seventh thin film transistors are controlled with the stage transfer signal of the GOA unit circuit of the former N−1th stage or the scan driving signal of the GOA unit circuit of the former N−1th stage to pull down the voltage levels of the fourth, fifth, second nodes under circumstance that the first node is not completely boosted to rapidly deactivate the pull-down holding module for ensuring the normal boost of the voltage level of the first node. The first node is guaranteed to be high voltage level in the functioning period, and thus, the normal output of the GOA circuit is ensured.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit based on oxide semiconductor thin film transistor, comprising a plurality of GOA unit circuits which are cascade connected, and the GOA unit circuit of every stage comprises a pull-up controlling module, a pull-up module, a transmission module, a first pull-down module, a bootstrap capacitor module and a pull-down holding module;

N is set to be a positive integer and except the GOA unit circuit of the first stage, in the GOA unit circuit of the Nth stage:

the pull-up controlling module comprises an eleventh thin film transistor, and a gate of the eleventh thin film transistor receives a stage transfer signal of the GOA unit circuit of the former N−1th stage, and a source is electrically coupled to a constant high voltage level, and a drain is electrically coupled to a first node;

the pull-up module comprises: a twenty-first thin film transistor, and a gate of the twenty-first thin film transistor is electrically coupled to the first node, and a source is electrically coupled to an mth clock signal, and a drain is electrically coupled to a scan driving signal;

the transmission module comprises: a twenty-second thin film transistor, and a gate of the twenty-second thin film transistor is electrically coupled to the first node, and a source is electrically coupled to the mth clock signal, and a drain outputs the stage transfer signal;

the first pull-down module comprises: a fortieth thin film transistor, and both a gate and a source of the fortieth thin film transistor are electrically coupled to the first node, and a drain is electrically coupled to the drain of a forty-first thin film transistor; a forty-first thin film transistor, and a gate of the forty-first thin film transistor is electrically coupled to an m+2th clock signal, and a source is electrically coupled to the drain of the fortieth thin film transistor, and a source receives the scan driving signal;

the bootstrap capacitor module comprises a capacitor, and one end of the capacitor is electrically coupled to the first node, and the other end is electrically coupled to the scan driving signal;

the pull-down holding module at least comprises: a fifty-first thin film transistor, and both a gate and a source of the fifty-first thin film transistor are electrically coupled to the constant high voltage level, and a drain is electrically coupled to a fourth node; a fifty-second thin film transistor, and a gate of the fifty-second thin film transistor is electrically coupled to the first node, and a drain is electrically coupled to the fourth node, and a source is electrically coupled to the first negative voltage level; a fifty-third thin film transistor, and a gate of the fifty-third thin film transistor is electrically coupled to the fourth node, and a source is electrically coupled to the constant high voltage level, and a drain is electrically coupled to the second node; a fifty-fourth thin film transistor, and a gate of the fifty-fourth thin film transistor is electrically coupled to the first node, and a source is electrically coupled to the second node, and a drain is electrically coupled to a fifth node; a seventy-third thin film transistor, and a gate of the seventy-third thin film transistor is electrically coupled to the fourth node, and a source is electrically coupled to the constant high voltage level, and a drain is electrically coupled to the fifth node; a seventy-fourth thin film transistor, and a gate of the seventy-fourth thin film transistor is electrically coupled to the first node, and a source is electrically coupled to a constant low voltage level, and a drain is electrically coupled to the fifth node; a fifty-fifth thin film transistor, and a gate of the fifty-fifth thin film transistor receives the stage transfer signal of the GOA unit circuit of the former N−1th stage or the scan driving signal of the GOA unit circuit of the former N−1th stage, and a source is electrically coupled to the fourth node, and a drain is electrically coupled to a first negative voltage level; a forty-second thin film transistor, and a gate of the forty-second thin film transistor is electrically coupled to the second node, and a source is electrically coupled to the first node, and a drain is electrically coupled to the third node; a thirty-second thin film transistor, and a gate of the thirty-second thin film transistor is electrically coupled to the second node, and a source is electrically coupled to the scan driving signal, and a drain is electrically coupled to the first negative voltage level; a seventy-fifth thin film transistor, and a gate of the seventy-fifth thin film transistor is electrically coupled to the first node, and a source is electrically coupled to the third node, and a drain is electrically coupled to the constant high voltage level; a seventy-sixth thin film transistor, and a gate of the seventy-sixth thin film transistor is electrically coupled to the second node, and a source is electrically coupled to the third node, and a drain is electrically coupled to the constant low voltage level;

the constant low voltage level is lower than the first negative voltage level;

all the thin film transistors in the GOA unit circuits of all stages are oxide semiconductor thin film transistors.

2. The GOA circuit based on oxide semiconductor thin film transistor according to claim 1, wherein the pull-down holding module further comprises: a fifty-sixth thin film transistor, and a gate of the fifty-sixth thin film transistor receives the stage transfer signal of the GOA unit circuit of the former N−1th stage or the scan driving signal of the GOA unit circuit of the former N−1th stage, and a source is coupled to the fifth node, and a drain is electrically coupled to the constant low voltage level.

3. The GOA circuit based on oxide semiconductor thin film transistor according to claim 1, wherein the pull-down holding module further comprises: a fifty-sixth thin film transistor, and a gate of the fifty-sixth thin film transistor receives the stage transfer signal of the GOA unit circuit of the former N−1th stage or the scan driving signal of the GOA unit circuit of the former N−1th stage, and a source is coupled to a fifth node, and a drain is electrically coupled to the constant low voltage level; a fifty-seventh thin film transistor, and a gate of the fifty-seventh thin film transistor receives the stage transfer signal of the GOA unit circuit of the former N−1th stage or the scan driving signal of the GOA unit circuit of the former N−1th stage, and a source is coupled to the second node, and a drain is electrically coupled to the fifth node.

4. The GOA circuit based on oxide semiconductor thin film transistor according to claim 1, wherein in the GOA unit circuit of the first stage, the gate of the eleventh thin film transistor receives a scan activation signal, and a gate of the fifty-fifth thin film transistor receives a scan activation signal.

5. The GOA circuit based on oxide semiconductor thin film transistor according to claim 2, wherein in the GOA unit circuit of the first stage, the gate of the eleventh thin film transistor receives a scan activation signal, and a gate of the fifty-fifth thin film transistor receives a scan activation signal, and a gate of the fifty-sixth thin film transistor receives a scan activation signal.

6. The GOA circuit based on oxide semiconductor thin film transistor according to claim 3, wherein in the GOA unit circuit of the first stage, the gate of the eleventh thin film transistor receives a scan activation signal, and a gate of the fifty-fifth thin film transistor receives a scan activation signal, and a gate of the fifty-sixth thin film transistor receives a scan activation signal, and a gate of the fifty-seventh thin film transistor receives a scan activation signal.

7. The GOA circuit based on oxide semiconductor thin film transistor according to claim 1, wherein in the pull-down holding module, the fifty-first thin film transistor, the fifty-second thin film transistor, the fifty-third thin film transistor, the fifty-fourth thin film transistor, the seventy-third thin film transistor, and the seventy-fourth thin film transistor construct a dual inverter, and the fifty-first thin film transistor, the fifty-second thin film transistor, the fifty-third thin film transistor and the fifty-fourth thin film transistor construct a main inverter, and the seventy-third thin film transistor, and the seventy-fourth thin film transistor construct an auxiliary inverter.

8. The GOA circuit based on oxide semiconductor thin film transistor according to claim 1, wherein the clock signal comprises four clock signals: a first clock signal, a second clock signal, a third clock signal and a fourth clock signal.

9. The GOA circuit based on oxide semiconductor thin film transistor according to claim 8, wherein as the mth clock signal is the third clock signal, the m+2th clock signal is the first clock signal, and as the mth clock signal is the fourth clock signal, the m+2th clock signal is the second clock signal.

10. The GOA circuit based on oxide semiconductor thin film transistor according to claim 1, wherein all the thin film transistors in the GOA unit circuits of all stages are IGZO thin film transistors.

11. A GOA circuit based on oxide semiconductor thin film transistor, comprising a plurality of GOA unit circuits which are cascade connected, and the GOA unit circuit of every stage comprises a pull-up controlling module, a pull-up module, a transmission module, a first pull-down module, a bootstrap capacitor module and a pull-down holding module;

N is set to be a positive integer and except the GOA unit circuit of the first stage, in the GOA unit circuit of the Nth stage:

the pull-up controlling module comprises an eleventh thin film transistor, and a gate of the eleventh thin film transistor receives a stage transfer signal of the GOA unit circuit of the former N−1th stage, and a source is electrically coupled to a constant high voltage level, and a drain is electrically coupled to a first node;

the pull-up module comprises: a twenty-first thin film transistor, and a gate of the twenty-first thin film transistor is electrically coupled to the first node, and a source is electrically coupled to an mth clock signal, and a drain is electrically coupled to a scan driving signal;

the transmission module comprises: a twenty-second thin film transistor, and a gate of the twenty-second thin film transistor is electrically coupled to the first node, and a source is electrically coupled to the mth clock signal, and a drain outputs the stage transfer signal;

the first pull-down module comprises: a fortieth thin film transistor, and both a gate and a source of the fortieth thin film transistor are electrically coupled to the first node, and a drain is electrically coupled to the drain of a forty-first thin film transistor; a forty-first thin film transistor, and a gate of the forty-first thin film transistor is electrically coupled to an m+2th clock signal, and a source is electrically coupled to the drain of the fortieth thin film transistor, and a source receives the scan driving signal;

the bootstrap capacitor module comprises a capacitor, and one end of the capacitor is electrically coupled to the first node, and the other end is electrically coupled to the scan driving signal;

the pull-down holding module at least comprises: a fifty-first thin film transistor, and both a gate and a source of the fifty-first thin film transistor are electrically coupled to the constant high voltage level, and a drain is electrically coupled to a fourth node; a fifty-second thin film transistor, and a gate of the fifty-second thin film transistor is electrically coupled to the first node, and a drain is electrically coupled to the fourth node, and a source is electrically coupled to the first negative voltage level; a fifty-third thin film transistor, and a gate of the fifty-third thin film transistor is electrically coupled to the fourth node, and a source is electrically coupled to the constant high voltage level, and a drain is electrically coupled to the second node; a fifty-fourth thin film transistor, and a gate of the fifty-fourth thin film transistor is electrically coupled to the first node, and a source is electrically coupled to the second node, and a drain is electrically coupled to a fifth node; a seventy-third thin film transistor, and a gate of the seventy-third thin film transistor is electrically coupled to the fourth node, and a source is electrically coupled to the constant high voltage level, and a drain is electrically coupled to the fifth node; a seventy-fourth thin film transistor, and a gate of the seventy-fourth thin film transistor is electrically coupled to the first node, and a source is electrically coupled to a constant low voltage level, and a drain is electrically coupled to the fifth node; a fifty-fifth thin film transistor, and a gate of the fifty-fifth thin film transistor receives the stage transfer signal of the GOA unit circuit of the former N−1th stage or the scan driving signal of the GOA unit circuit of the former N−1th stage, and a source is electrically coupled to the fourth node, and a drain is electrically coupled to a first negative voltage level; a forty-second thin film transistor, and a gate of the forty-second thin film transistor is electrically coupled to the second node, and a source is electrically coupled to the first node, and a drain is electrically coupled to the third node; a thirty-second thin film transistor, and a gate of the thirty-second thin film transistor is electrically coupled to the second node, and a source is electrically coupled to the scan driving signal, and a drain is electrically coupled to the first negative voltage level; a seventy-fifth thin film transistor, and a gate of the seventy-fifth thin film transistor is electrically coupled to the first node, and a source is electrically coupled to the third node, and a drain is electrically coupled to the constant high voltage level; a seventy-sixth thin film transistor, and a gate of the seventy-sixth thin film transistor is electrically coupled to the second node, and a source is electrically coupled to the third node, and a drain is electrically coupled to the constant low voltage level;

the constant low voltage level is lower than the first negative voltage level;

all the thin film transistors in the GOA unit circuits of all stages are oxide semiconductor thin film transistors;

wherein the clock signal comprises four clock signals: a first clock signal, a second clock signal, a third clock signal and a fourth clock signal;

wherein as the mth clock signal is the third clock signal, the m+2th clock signal is the first clock signal, and as the mth clock signal is the fourth clock signal, the m+2th clock signal is the second clock signal;

wherein all the thin film transistors in the GOA unit circuits of all stages are IGZO thin film transistors.

12. The GOA circuit based on oxide semiconductor thin film transistor according to claim 11, wherein the pull-down holding module further comprises: a fifty-sixth thin film transistor, and a gate of the fifty-sixth thin film transistor receives the stage transfer signal of the GOA unit circuit of the former N−1th stage or the scan driving signal of the GOA unit circuit of the former N−1th stage, and a source is coupled to a fifth node, and a drain is electrically coupled to the constant low voltage level.

13. The GOA circuit based on oxide semiconductor thin film transistor according to claim 11, wherein the pull-down holding module further comprises: a fifty-sixth thin film transistor, and a gate of the fifty-sixth thin film transistor receives the stage transfer signal of the GOA unit circuit of the former N−1th stage or the scan driving signal of the GOA unit circuit of the former N−1th stage, and a source is coupled to a fifth node, and a drain is electrically coupled to the constant low voltage level; a fifty-seventh thin film transistor, and a gate of the fifty-seventh thin film transistor receives the stage transfer signal of the GOA unit circuit of the former N−1th stage or the scan driving signal of the GOA unit circuit of the former N−1th stage, and a source is coupled to the second node, and a drain is electrically coupled to the fifth node.

14. The GOA circuit based on oxide semiconductor thin film transistor according to claim 11, wherein in the GOA unit circuit of the first stage, the gate of the eleventh thin film transistor receives a scan activation signal, and a gate of the fifty-fifth thin film transistor receives a scan activation signal.

15. The GOA circuit based on oxide semiconductor thin film transistor according to claim 12, wherein in the GOA unit circuit of the first stage, the gate of the eleventh thin film transistor receives a scan activation signal, and a gate of the fifty-fifth thin film transistor receives a scan activation signal, and a gate of the fifty-sixth thin film transistor receives a scan activation signal.

16. The GOA circuit based on oxide semiconductor thin film transistor according to claim 13, wherein in the GOA unit circuit of the first stage, the gate of the eleventh thin film transistor receives a scan activation signal, and a gate of the fifty-fifth thin film transistor receives a scan activation signal, and a gate of the fifty-sixth thin film transistor receives a scan activation signal, and a gate of the fifty-seventh thin film transistor receives a scan activation signal.

17. The GOA circuit based on oxide semiconductor thin film transistor according to claim 11, wherein in the pull-down holding module, the fifty-first thin film transistor, the fifty-second thin film transistor, the fifty-third thin film transistor, the fifty-fourth thin film transistor, the seventy-third thin film transistor, and the seventy-fourth thin film transistor construct a dual inverter, and the fifty-first thin film transistor, the fifty-second thin film transistor, the fifty-third thin film transistor and the fifty-fourth thin film transistor construct a main inverter, and the seventy-third thin film transistor, and the seventy-fourth thin film transistor construct an auxiliary inverter.

* * * * *